United States Patent
Onaya et al.

(10) Patent No.: US 7,808,857 B2
(45) Date of Patent: Oct. 5, 2010

(54) ANALOG MEMORY

(75) Inventors: Masato Onaya, Ora-gun (JP); Shunsuke Serizawa, Maebashi (JP)

(73) Assignees: Sanyo Electric Co., Ltd., Moriguchi-shi (JP); Sanyo Semiconductor Co., Ltd., Gunma (JP)

( * ) Notice: Subject to any disclaimer, the term of this patent is extended or adjusted under 35 U.S.C. 154(b) by 179 days.

(21) Appl. No.: 11/861,437

(22) Filed: Sep. 26, 2007

(65) Prior Publication Data

US 2008/0074912 A1 Mar. 27, 2008

(30) Foreign Application Priority Data

Sep. 27, 2006 (JP) .............................. 2006-263209

(51) Int. Cl.
*G11C 8/00* (2006.01)
(52) U.S. Cl. ............................ 365/230.03; 365/185.25; 365/45
(58) Field of Classification Search ............ 365/230.03, 365/185.25, 45, 230.06, 191, 185.23, 189.05, 365/207, 204
See application file for complete search history.

(56) References Cited

U.S. PATENT DOCUMENTS 4,807,168 A * 2/1989 Moopenn et al. .............. 706/37
6,061,279 A * 5/2000 Toda et al. .................. 365/194
6,529,049 B2 * 3/2003 Erhart et al. .................. 327/94

FOREIGN PATENT DOCUMENTS

JP 2006-186562 7/2006

* cited by examiner

*Primary Examiner*—Dang T Nguyen
(74) *Attorney, Agent, or Firm*—Westerman, Hattori, Daniels & Adrian, LLP

(57) ABSTRACT

According to a preferred embodiment of the present invention, an analog memory includes a first to third memory blocks. Each of the first to third memory blocks includes a plurality of capacitive elements for storing electric charges corresponding to an input signal, an output line for transferring the electric charges, and a plurality of MOS transistors each for changing connection between the capacitive element and the output line. When a signal is outputted from the output line to a buffer circuit by sequentially connecting the capacitive element to the output line in the first memory block, all connections between the capacitive elements and the output line are disconnected in the second and third memory blocks with the output line of the first memory block and the output line of the second memory block connected.

12 Claims, 3 Drawing Sheets

SL1+SL2

| Time | T0    | T1     | T2     | T3     | T4     |
|------|-------|--------|--------|--------|--------|
| Min  | Min11 | Min12  | Min13  | Min14  | Min21  |
| Mout |       | Mout11 | Mout12 | Mout13 | Mout14 |

SL2+SL3 ⇩

| Time | T5     | T6     | T7     | T8     |
|------|--------|--------|--------|--------|
| Min  | Min22  | Min23  | Min24  | Min31  |
| Mout | Mout21 | Mout22 | Mout23 | Mout24 |

SL3+SL4 ⇩

| Time | T9     | T10    | T11    | T12    |
|------|--------|--------|--------|--------|
| Min  | Min32  | Min33  | Min34  | Min41  |
| Mout | Mout31 | Mout32 | Mout33 | Mout34 |

SL4+SL1 ⇩

| Time | T13    | T14    | T15    | T16    |
|------|--------|--------|--------|--------|
| Min  | Min42  | Min43  | Min44  | Min11  |
| Mout | Mout41 | Mout42 | Mout43 | Mout44 |

FIG. 2

ANALOG MEMORY

This application claims priority under 35 U.S.C. §119 to Japanese Patent Application No. 2006-263209 filed on Sep. 27, 2006, the entire disclosure of which is incorporated herein by reference in its entirety.

BACKGROUND OF THE INVENTION

1. Field of the Invention

The present invention relates an analog memory preferably for use in a Y/C separation circuit.

2. Description of the Related Art

The following description sets forth the inventor's knowledge of related art and problems therein and should not be construed as an admission of knowledge in the prior art.

An analog TV signal is represented by a NTSC (National Telecision Standards Committee) type signal, a PAL (Phase Alternation by Line) type signal, and a SECAM (SEquential Color and Memory). Such analog TV signal is transmitted as a composite signal SC in which a luminance signal Y showing brightness of a screen and a chrominance signal showing light and shade of a screen color are composed.

In analog TV signal processing, a Y/C separation circuit plays an important role for separating a transmitted composite signal SC into a luminance signal Y and a chrominance signal C.

The luminance signal Y is represented by the signal strength of the DC component of the composite signal SC. On the other hand, the chrominance signal C is superimposed on the luminance signal Y with the phase shifted by 180 degree every one horizontal line (see FIG. 3).

Thus, as shown in FIG. 4, by adding one of horizontal line to the other horizontal line with the one of horizontal line delayed by one horizontal scanning time, a trap filter for extracting only the luminance signal from the composite signal SC can be constituted. On the other hand, by subtracting one horizontal line from the other horizontal line with the one horizontal line delayed by one horizontal scanning time, a bandpass filter for extracting only the chrominance signal C from the composite signal SC can be constituted. Thus, a Y/C separation circuit requires an analog memory for delaying the composite signal SC.

An example of a conventional analog memory is shown in FIG. 5. In FIG. 5, only four sets of switched capacitor portions are illustrated for the sake of simplified explanation. In actuality, however, the switched capacitor portions SC are provided by the number corresponding to the delay time required for the input signal Vin.

In each switched capacitor portion SC1-SC4, the capacitive element C1-C4 is configured to charge and discharges the electric charges corresponding to the input signal Vin. On end of the switched capacitor portion SC1-SC4 is commonly connected to the source of the first MOS transistor Min1-Min4 and that of the second MOS transistor Mout1-Mout4 and the other end is grounded. The drain of each first MOS transistor Min1-Min4 is connected to the charge line Lin to which an input signal Vin as an delay object is applied. On the other hand, the drain of each second MOS transistor Mout1-Mout4 is connected to the non-inverting input terminal of the operational amplifier OP via the discharge line Lout. In the operational amplifier OP, the inverting input terminal (+) and the output terminal are connected in a negative feedback arrangement.

In each switched capacitor portion SC1-SC4, the first MOS transistor Min1-Min4 functions as a charge switch for charging the capacitive element C1-C4 in accordance with the input signal Vin. On the other hand, the second MOS transistor Mout1-Mout4 functions as a discharge switch for discharging the capacitive element C1-C4.

In this structure, the gates of the first and second MOS transistors Min1-Min4 and Mout1-Mout4 are on-off controlled, so that the input voltage Vin is outputted to the operational amplifier OP with the input voltage delayed by the switching cycle.

Japanese Unexamined Laid-open Patent Publication No. 2006-186562 can be exemplified as the related reference.

In the aforementioned analog memory, the discharge line Lout is connected to each of the drains of the second MOS transistors Mout1-Mout4 constituting the switched capacitor portions SC1-SC4. Thus, each of the second MOS transistor Mout1-Mout4 has a potential parasitic capacitance of a few femto (F) between the drain and the substrate.

It seems that the parasitic capacitance can be neglected because of the pico order capacitance value of each capacitive element. As mentioned above, however, the switched capacitor portions SC are provided by the number corresponding to the delay time required for the input signal Vin. For example, in cases where the input signal Vin is a composite signal SC containing a superimposed chrominance signal having a center wave of 3.58 MHz, in order to perform the sampling of the composite signal SC at the sampling frequency four times of the chrominance signal frequency, in the NTSC type, a total of 911 pieces of switched capacitor portions SC are provided to perform the sampling for one horizontal line since the horizontal scanning frequency is 15.734 Hz. In this case, the discharge line Lout is connected to the drains of 911 second MOS transistors Mout, resulting in a total large parasitic capacitance potentially existed in the discharge line Lout. This large parasitic capacitance causes unignorable large errors between the input signal Vin and the output signal Vout.

The description herein of advantages and disadvantages of various features, embodiments, methods, and apparatus disclosed in other publications is in no way intended to limit the present invention. For example, certain features of the preferred embodiments of the invention may be capable of overcoming certain disadvantages and/or providing certain advantages, such as, e.g., disadvantages and/or advantages discussed herein, while retaining some or all of the features, embodiments, methods, and apparatus disclosed therein.

SUMMARY OF THE INVENTION

The preferred embodiments of the present invention have been developed in view of the above-mentioned and/or other problems in the related art. The preferred embodiments of the present invention can significantly improve upon existing methods and/or apparatuses.

Among other potential advantages, some embodiments can provide an analog memory capable of reducing potentially existing parasitic capacitance of a discharge line.

Among other potential advantages, some embodiments can provide an analog memory capable of preventing possible distortion of an output signal.

According to a first aspect of a preferred embodiment of the present invention, an analog memory, comprises: a plurality of memory blocks for charging and discharging electric charges corresponding to an input signal, each of the plurality of memory blocks including a plurality of switched capacitor portions each having a capacitive element, a first switching element with an input terminal and a second switching element with an output terminal; a charge line commonly connected to the input terminals of the plurality of the switched capacitor portions of the plurality of memory blocks; a plurality of discharge lines each commonly connected to the output terminals of the switched capacitor portions in each memory block; and a buffer circuit disconnectably connected to each of the plurality of memory blocks via the corresponding discharge line and configured to output an output signal. The plurality of memory blocks are configured to sequentially discharge the electric charges to the buffer circuit via the corresponding discharge line, and discharging of one of the plurality of memory blocks is performed in a state in which a subsequent memory block supposed to perform the subsequent discharging is connected to the buffer circuit with the remaining memory blocks disconnected from the butter circuit.

According to the aforementioned embodiment, since the discharge line is divided into a plurality of discharge lines, the number of second switching elements connected to the discharge line per one line can be reduced. This can reduce potentially existing parasitic capacitance of the discharge line per line. Furthermore, since discharging of one of the plurality of memory blocks is performed in a state in which a subsequent memory block supposed to perform the subsequent discharging is connected to the buffer circuit with the remaining memory blocks disconnected from the butter circuit, possible distortion of the output signal can be prevented at the time of switching the discharging lines.

According to a second aspect of a preferred embodiment of the present invention, an analog memory comprises a first to third memory blocks. Each of the first to third memory blocks includes a plurality of capacitive elements for storing electric charges corresponding to an input signal, an output line for transferring the electric charges, and a plurality of MOS transistors each for changing connection between the capacitive element and the output line. This analog memory is configured such that, when a signal is outputted from the output line to a buffer circuit by sequentially connecting the capacitive element to the output line in the first memory block, all connections between the capacitive elements and the output line are disconnected in the second and third memory blocks with the output line of the first memory block and the output line of the second memory block connected.

In this embodiment, the same effects as mentioned above can be attained.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

BRIEF DESCRIPTION OF THE DRAWINGS

The preferred embodiments of the present invention are shown by way of example, and not limitation, in the accompanying figures, in which:

FIG. 2 is a timing chart showing the operation of the analog memory shown in FIG. 1;

DETAILED DESCRIPTION OF THE PREFERRED EMBODIMENTS

In the following paragraphs, some preferred embodiments of the invention will be described by way of example and not limitation. It should be understood based on this disclosure that various other modifications can be made by those in the art based on these illustrated embodiments.

Figure 1:
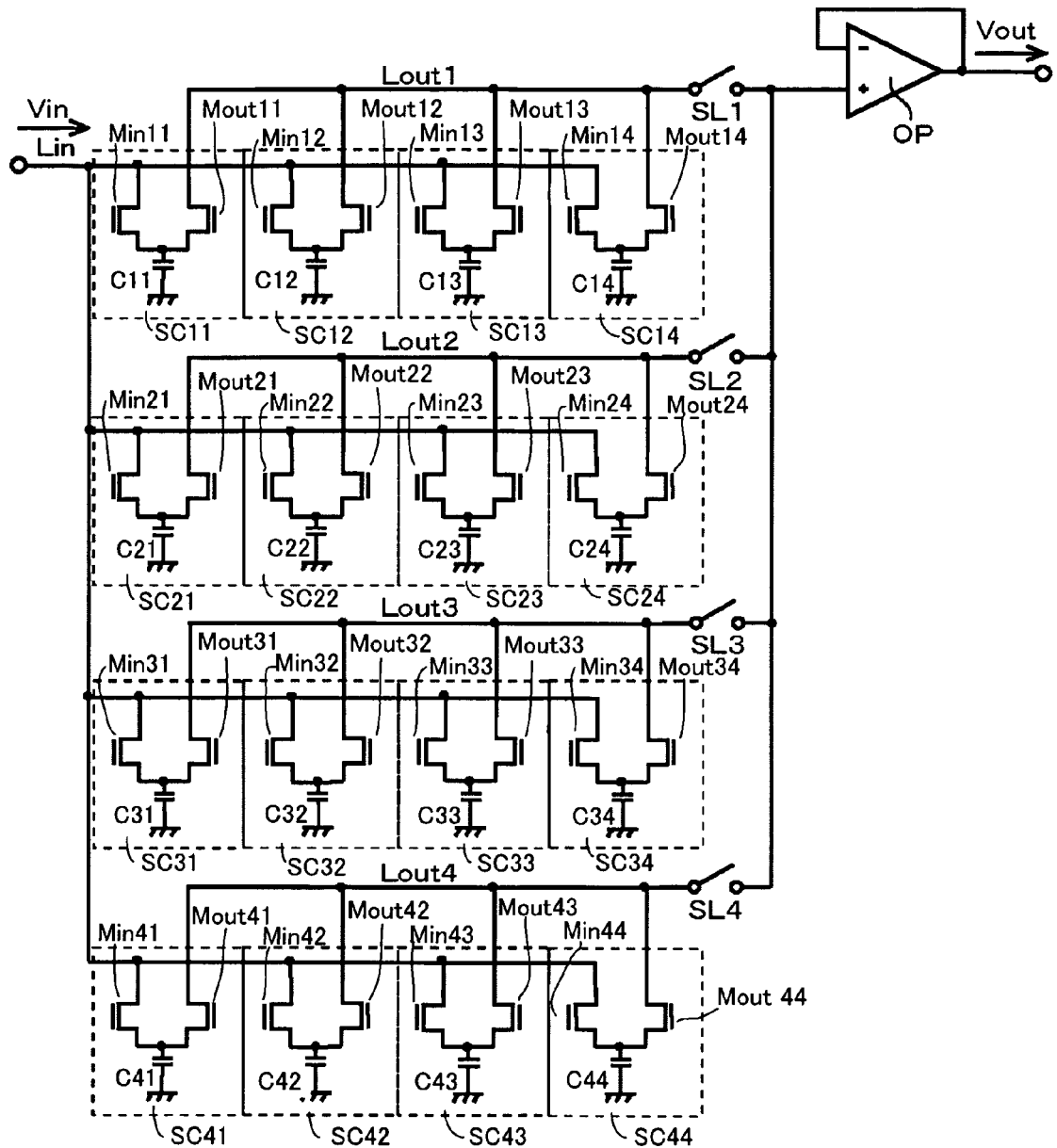
FIG. 1 is a circuit diagram showing an analog memory according to an embodiment of the present invention.
Figure 3:
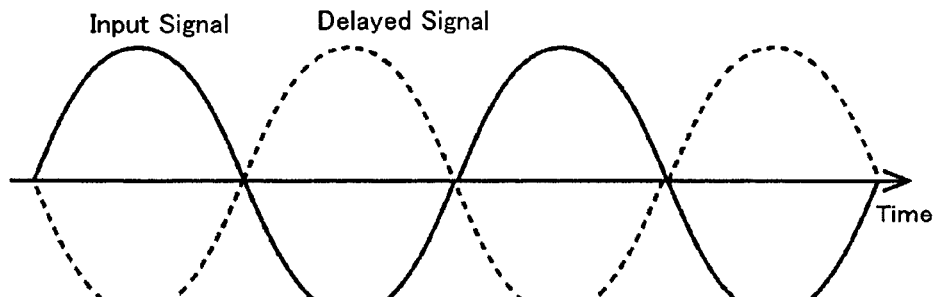
FIG. 3 is a waveform chart for explaining a chrominance signal.
Figure 4:
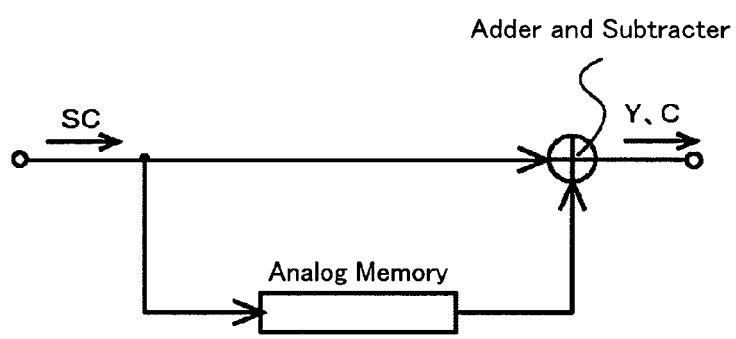
FIG. 4 is a block diagram for explaining a Y/C separation circuit.
Figure 5:
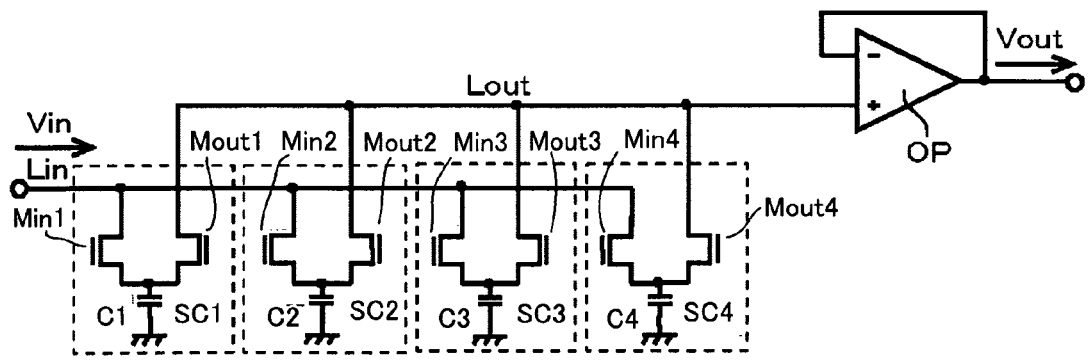
FIG. 5 is a circuit diagram of a conventional analog memory.

An embodiment of the present invention will be detailed with reference to the attached drawings. FIG. 1 is a circuit diagram showing an analog memory according to an embodiment of the present invention.

The analog memory shown in FIG. 1 includes 16 switched capacitors SC11-SC44. Each switched capacitor is constituted by a capacitive element, a first MOS transistor, and a second MOS transistor. For example, the upper left switched capacitor SC11 is constituted by a capacitive element C11, a first MOS transistor Min11, and a second MOS transistor Mout11. The remaining switched capacitors SC12-SC44 are constituted in the same manner. In this embodiment, for the explanatory purpose, only 16 switched capacitors SC11-SC44 are illustrated. In an actual analog memory, however, the switched capacitors are provided by the number corresponding to the delay time required for the input signal Vin. For example, in cases where the input signal Vin is a composite signal SC containing a superimposed chrominance signal having a center wave of 3.58 MHz, in order to perform the sampling of the composite signal SC at the sampling frequency four times of the chrominance signal frequency, in the NTSC type, a total of 911 sets of switched capacitor portions SC are provided to perform the sampling for one horizontal line since the horizontal scanning frequency is 15.734 Hz.

In each switched capacitor portion SC11-SC44, each capacitive element C11-C44 is configured to charge and discharge the charges based on the input signal Vin. Furthermore, in each switched capacitor portion SC11-SC44, each capacitive element C11-C44 is commonly connected to the corresponding source terminals of the first and second MOS transistor Min11-Min44 and Mout11-Mout44 at one end with the other end grounded. For example, the switched capacitive element C11 is commonly connected to the source of the first MOS transistor Min11 and the source of the second MOS transistor Mout11 at one end with the other end grounded.

In the aforementioned structure, the first MOS transistor Min11-Min44 functions as a charging switch for charging the capacitive element C11-C44 in accordance with the input signal Vin. On the other hand, the second MOS transistor Mout11-Mout44 functions as a discharging switch for discharging the capacitive element C11-C44.

Concretely, the drain terminals of the first MOS transistors Min11-Min44 are commonly connected to the charge line Lin so as to receive the input signal Vin as a delay object.

On the other hand, the drain terminals of the second MOS transistors Mout11-Mout44 are commonly connected to corresponding one of discharging lines Lout1-Lout4. Concretely, the drain terminals of the second MOS transistors Mout11-Mout14 are commonly connected to the discharging line Lout1. The drain terminals of the second MOS transistors Mout21-Mout24 are commonly connected to the discharging line Lout2. The drain terminals of the second MOS transistors Mout31-Mout34 are commonly connected to the discharging line Lout3. The drain terminals of the second MOS transistors Mout41-Mout44 are commonly connected to the discharging line Lout4.

The discharge lines Lout1-Lout4 are commonly connected to the non-inverting input terminal of the operational amplifier OP via a line selection switch SL1-Sl4 provided at the respective discharge line. This operational amplifier OP is an output stage in which the inverting input terminal (+) and the output terminal are connected in a negative feedback arrangement.

The analog memory according to the present invention is characterized in that effects of parasitic capacitance potentially existing in the respective discharge line Lout1-Lout4 can be reduced. In detail, each second MOS transistor Mout11-Mout44 has a few femto potential parasitic capacitance between the drain and the substrate. Thus, the total amount of parasitic capacitance existing in the discharge line Lout increases in proportion to the number of switched capacitor portions SC connected to the discharge line Lout. In this regard, according to a conventional analog memory, if the number of switched capacitor portions SC is increased to increase the delay time, the parasitic capacitance increases in proportion to the increased number of the switched capacitor portions SC because of the single discharge line Lout, resulting in an increased error between the input signal Vin and the output signal Vout.

To the contrary, in the analog memory according to the present invention, the parasitic capacitance can be held constant irrespective of the installed number of the switched capacitor portions SC. Concretely, the connection between the operational amplifier OP and the discharge lines Lout1-Lout4 is controlled by the line selection switches SL1-SL4 to reduce the effects of parasitic capacitance. Hereinafter, the operation of the analog memory of the present embodiment will be explained to reveal the principle of reducing the effects of parasitic capacitance.

FIG. 2 shows an example of a timing chart of the analog memory according to this embodiment. The following explanation will be directed to the case in which the delay is caused in a minimal time period for the purpose of simplifying the explanation. However, in practice, in one switched capacitor portion SC, the time period between the charge and the discharge is set to, for example, one horizontal scanning time period. In this embodiment, an input signal Vin is inputted to the charge line Lin. In the pre-operation state, all of the line selection switches SL1-SL4, the first MOS transistors Min11-Min44, the second MOS transistors Mout11-Mout44 are in an off-state. The time periods TO-T16 are the same.

Initially, the line selection switches SL1 and SL2 are turned on. Thus, the discharge lines Lout1 and Lout2 are commonly connected to the non-inverting input terminal (+) of the operational amplifier OP.

In this state, at the time T0, turning on the first MOS transistor Min11, the capacitive element C11 and the charge line Lin are connected. As a result, in the switched capacitor portion SC11, the charges corresponding to the input signal Vin at the time T0 are charged in the capacitive element C11. In other words, the information of the input signal Vin at the time T0 is held by the capacitive element C11.

Next, at the time T1, the first MOS transistor Min11 of the switched capacitor portion SC11 is turned off and the second MOS transistor Mout11 of the switched capacitor portion SC11 and the first MOS transistor Min12 of the switched capacitive portion SC12 are turn on. Thus, the capacitive element C11 of the switched capacitor portion SC11 and the discharge line Lout1 are connected and the capacitive element C12 of the switched capacitor portion SC12 and the charge line Vin are connected. As a result, in the switched capacitor portion SC12, the charges corresponding to the input signal Vin at the time T1 are charged in the capacitive element C12. In other words, the information of the input signal Vin at the time T1 is held by the capacitive element C12. Furthermore, the charges held in the capacitive element C11 of the switched capacitor portion SC1 is discharged to the discharge line Lout1 and therefore the information of the input signal Vin at the time T0 is outputted from the operational amplifier OP. In other words, at the time T1, the information of the input signal Vin at the time T0 is outputted in a delayed manner.

In this state, at the time T1, the line selection switches SL1 and SL2 are in a turned-on state while the line selection switches SL3 and SL4 are in a turned-off state. Thus, at the time T1, only the discharge lines Lout1 and Lout2 are connected to the non-inverting terminal (+) of the operational amplifier OP. Accordingly, in the analog memory of this embodiment, although a total of sixteen switched capacitor portions SC are provided, parasitic capacitance which affects the output signal Vout can be limited to the parasitic capacitance of the eight second MOS transistors Mout11-Mout24. As mentioned above, in the actual analog memory, for example, 911 sets of switched capacitor portions SC are provided to perform the sampling of one horizontal line of the input signal Vin, and therefore the discharge line Lout will be divided into more divided discharge lines. As will be understood from the above, although the effects of parasitic capacitance decreased by half since the discharge line Lout is divided into 4 divided discharge lines in the analog memory of this embodiment, it should be noted that in the actual analog memory the parasitic capacitance depression effect can be increased depending on the division number of the discharge line Lout. For example, in the case where the discharge line Lout is divided into 10 divided discharge lines, the parasitic capacitance effects can be reduced into 20% since only two divided discharge lines are connected to the operational amplifier OP.

The same operation will be performed at the time T2 to the time T4.

When the operation at the time T4 changes to the operation at the time T5, the line selection switch SL1 is turned off and the line selection switches SL2 and SL3 are turned on. Thus, the discharge lines Lout2 and Lout3 are connected to the non-inverting input terminal (+) of the operational amplifier OP.

At the time T5, the first MOS transistor Min21 of the switched capacitor portion SC21 and the second MOS transistor Mout14 of the switched capacitor portion SC14 are turned off, while the first MOS transistor Min22 of the switched capacitor element SC22 and the second MOS transistor Mout21 of the switched capacitor element SC21 are turned on. Thus, the capacitive element C22 and the charge line Lin are connected and the capacitive element C21 and the discharge line Lout2 are connected. As a result, in the switched capacitor portion SC22, charges corresponding to the input signal Vin at the time T5 are charged in the capacitive element C21. Furthermore, in the switched capacitor portion SC21, the charges held by the capacitive element C21 is discharged to the discharge line Lout2. Thus, the information of the input signal Vin at the time T4 is outputted from the operational amplifier OP.

At the time T6 to the time T16, the same operation will be performed. Furthermore, at the time of the transition from the time T8 to the time T9 as well as the transition from the time T12 to the time T13, the line selection switches SL1-SL4 change as shown in the timing chart of FIG. 2.

In this embodiment, at the time T0 to T4, the line selection switches SL1 and SL2 are in a turned-on state. In this period, the switched capacitor portions SC11 to SC14 as discharge objects are connected only to the discharge line Lout1. Therefore, it seems to be preferable that the line selection switch SL2 is turned off to decrease the total amount of the parasitic capacitance to decrease the parasitic capacitance effects to the output signal Vout. Similarly, it seems to be preferable that the line selection switch SL2, the line selection switch SL3 and the line selection switch SL4 are turned off at the time T5 to T8, at the time T9 to T12 and at the time T13 to T16, respectively, to decrease the total amount of the parasitic capacitance to decrease the parasitic capacitance effects to the output signal Vout. However, in this operation, at the time before and after the changing of the line selection switches SL1 to SL2, i.e., the time T4 and the time T5, the time T8 and the time T9, and the time T12 and the time T13, the continuity of the output signal Vout will be interrupted, causing generation of noise.

In the above hypothetical case, at the time T0 to T4, to the non-inverting input terminal (+) of the operational amplifier OP, only the discharge line Lout1 is connected. Thus, at the time T0 to T3, the parasitic capacitance of the discharge line Lout1 is also charged. However, at the moment changing from the time T4 to the time T5, the parasitic capacitance cannot be fully discharged. On the other hand, at this moment, no charge has been charged in the parasitic capacitance existing on the discharge line Lout2. When the time has changed to T5, the charges existing on the discharge line Lout1 will not be charged, while a part of the charges of the capacitive element C21 will be charged to the parasitic capacitance of the discharge line Lout2. Thus, between the time T4 and the time T5, the continuity of the output signal Vout is interrupted substantially. The same thing can be said at the time T12 and the time T13.

To the contrary, in this embodiment, at the time T4, the line selection switch SL1 and the line selection switch SL2 are in a turned-on state. Therefore, even if the line selection switch SL1 is turned on and the line selection switches SL2 and SL3 are turned off at the transition of the time T4 to the time T5, charges still remain in the parasitic capacitance of the line selection switch SL2. Thus, the interruption of the continuity of the output signal Vout at between the time T4 and the time T5 can be reduced. In the same manner, the interruption can be reduced at between the time T8 and the time T9 and between the time T12 and the time T13.

In the analog memory according to the embodiment, since the discharge line Lout is divided into plural divided lines, the number of the second MOS transistors Mout to be connected to the non-inverting output terminal (+) of the operational amplifier OP can be reduced. Therefore, the total amount of parasitic capacitance which affects the output signal Vout can be reduced.

Furthermore, in the analog memory according to the embodiment, one discharge line Lout which is currently being used for discharging and another discharge line Lout which will be used for discharging at the next stage are connected to the non-inverting input terminal (+) of the operational amplifier OP. Therefore, even if the line selection switches SL are switched, the parasitic capacitance effects to the output signal Vout can be reduced.

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

For example, in the analog memory of the aforementioned embodiment, even at the period during which no switching of the line selection switches SL was performed, i.e., at the time T0-T3, T6-T7, T10-T11, and T14-T15, two line selection switches SL are always kept in a turned-on state. However, it should be understood that the present invention is not limited to the aforementioned control, and allows any other control so long as it is controlled such that line selection switches SL involved in the current discharging and the following discharging are turned on at the switching period of the line selection switches SL, i.e., at the time T4, T5, T8, T9, T12, T13, and T16.

Furthermore, in the analog memory of the aforementioned embodiment, it is constituted such that the time between charge and discharge is minimum in one switched capacitor portion SC. However, the present invention is not limited to the above, and the time between charge and discharge can be set arbitrarily. For example, in a Y/C separation circuit, the time between charge and discharge can be one horizontal scanning time at one switched capacitor portion SC.

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" is meant as an non-specific, general reference and may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure and during the prosecution of this case, the following abbreviated terminology may be employed: "e.g." which means "for example;" and "NB" which means "note well."

What is claimed is:

1. An analog memory, comprising:
a plurality of memory blocks for charging and discharging electric charges corresponding to an input signal, each of the plurality of memory blocks including a plurality of switched capacitor portions each having a capacitive element, a first switching element with an input terminal and a second switching element with an output terminal;

a charge line commonly connected to the input terminals of the plurality of the switched capacitor portions of the plurality of memory blocks;

a plurality of discharge lines each commonly connected to the output terminals of the switched capacitor portions in each of the plurality of memory blocks; and a buffer circuit disconnectably connected to each of the plurality of memory blocks via the corresponding discharge line and configured to output an output signal, wherein the plurality of memory blocks are configured to sequentially discharge the electric charges to the buffer circuit via the corresponding discharge line, and wherein discharging of one of the plurality of memory blocks is performed in a state in which a subsequent memory block supposed to perform the subsequent discharging is connected to the buffer circuit with the remaining memory blocks disconnected from the butter circuit.

2. The analog memory as recited in claim 1, wherein the first switching element is a MOS transistor and the second switching element is a MOS transistor.

3. The analog memory as recited in claim 1, wherein the one of the plurality of memory blocks and the subsequent memory block are connected to the buffer circuit via the corresponding discharge lines with the remaining memory blocks disconnected from the butter circuit at least during a time period in which a last stage switched capacitor portion in the one of the memory blocks performs charging and a first stage switched capacitor portion in the subsequent memory block performs discharging.

4. The analog memory as recited in claim 1, wherein each of the plurality of switched capacitor portions comprises a first MOS transistor as the first switching element functioning as a charging switch, a second MOS transistor as the second switching element functioning as a discharging switch, and a capacitive element for charging the electric charges, and wherein each of the plurality of switched capacitor portions is configured such that one end of the capacitive element is commonly connected to a source of the first MOS transistor and a source of the second MOS transistor with the other end grounded and the charge line is connected to a drain of the first MOS transistor and the discharge lines is connected to a drain of the second MOS transistor.

5. The analog memory as recited in claim 1, wherein connection of the plurality of memory blocks to the buffer circuit is controlled by operating line selection switches provided in each of the plurality of the discharge lines.

6. The analog memory as recited in claim 1, wherein the buffer circuit comprises an operational amplifier having an inverting input terminal and an output terminal in which the inverting input terminal and the output terminal are connected in a negative feedback arrangement.

7. An analog memory, comprising a first to third memory blocks, wherein each of the first to third memory blocks includes:

a plurality of capacitive elements for storing electric charges corresponding to an input signal;

an output line for transferring the electric charges; and a plurality of MOS transistors each for changing connection between the capacitive element and the output line, wherein, when a signal is outputted from the first memory block to a buffer circuit via the output line of the first memory block by sequentially connecting the capacitive element in the first memory block to the output line thereof, the capacitive elements and the output line in the second and third memory blocks are disconnected with the first memory block and the second memory block connected to the buffer circuit via the output lines of the first and second memory blocks.

8. The analog memory as recited in claim 7, wherein the output line of the first memory block and the output line of the third memory block are disconnected.

9. The analog memory as recited in claim 7, wherein the input signal is impressed to the first to third memory blocks via a common input line.

10. The analog memory as recited in claim 7, wherein the buffer circuit comprises an operational amplifier having an inverting input terminal and an output terminal in which the inverting input terminal and the output terminal are connected in a negative feedback arrangement.

11. The analog memory as recited in claim 1, further comprising a plurality of line selection switches each provided between each of the plurality of the memory blocks and the butter circuit.

12. The analog memory as recited in claim 7, further comprising a plurality of line selection switches each provided between each of the plurality of memory blocks and the butter circuit.

* * * * *